(12) United States Patent
Prejbeanu et al.

(10) Patent No.: US 9,583,695 B2
(45) Date of Patent: *Feb. 28, 2017

(54) MAGNETIC LOGIC UNIT (MLU) CELL AND AMPLIFIER HAVING A LINEAR MAGNETIC SIGNAL

(71) Applicant: CROCUS Technology SA, Grenoble (FR)

(72) Inventors: Ioan Lucian Prejbeanu, Seyssinet Pariset (FR); Bernard Dieny, Lans-en-Vercors (FR); Kenneth MacKay, Le Sappey en Chartreuse (FR); Bertrand Cambou, Palo Alto, CA (US)

(73) Assignee: CROCUS TECHNOLOGY SA, Grenoble (FR)

( * ) Notice: Subject to any disclaimer, the term of this patent is extended or adjusted under 35 U.S.C. 154(b) by 62 days.

This patent is subject to a terminal disclaimer.

(21) Appl. No.: 14/431,125

(22) PCT Filed: Sep. 12, 2013

(86) PCT No.: PCT/EP2013/068867
§ 371 (c)(1),
(2) Date: Mar. 25, 2015

(87) PCT Pub. No.: WO2014/048758
PCT Pub. Date: Apr. 3, 2014

(65) Prior Publication Data
US 2015/0228888 A1 Aug. 13, 2015

(30) Foreign Application Priority Data
Sep. 25, 2012 (EP) .................................... 12290315

(51) Int. Cl.
*H01L 43/02* (2006.01)
*H03F 15/00* (2006.01)
(Continued)

(52) U.S. Cl.
CPC .............. *H01L 43/02* (2013.01); *G11C 11/16* (2013.01); *G11C 11/1675* (2013.01); *H03F 15/00* (2013.01); *H03K 19/18* (2013.01)

(58) Field of Classification Search
CPC ......... H01L 43/02; H01L 43/06; G11C 11/16; G11C 11/1675; H03F 15/00; H03K 19/18
See application file for complete search history.

(56) References Cited

U.S. PATENT DOCUMENTS 6,356,147 B1 3/2002 Ghoshal
7,518,897 B2 * 4/2009 Nozieres ................. G11C 11/16
365/173

(Continued)

FOREIGN PATENT DOCUMENTS

WO 2009074411 A1 6/2009

OTHER PUBLICATIONS

International Search Report for PCT/EP2013/068867 dated Oct. 9, 2013.
Written Opinion for PCT/EP2013/068867 dated Oct. 9, 2013.

*Primary Examiner* — Allison P Bernstein
(74) *Attorney, Agent, or Firm* — Pearne & Gordon LLP

(57) ABSTRACT

A magnetic logic unit (MLU) cell includes a first magnetic tunnel junction and a second magnetic tunnel junction, each magnetic tunnel junction including a first magnetic layer having a first magnetization, a second magnetic layer having a second magnetization, and a tunnel barrier layer between the first and second layer. A field line for passing a field current such as to generate an external magnetic field is adapted to switch the first magnetization. The first magnetic
(Continued)

layer is arranged such that the magnetic tunnel junction magnetization varies linearly with the generated external magnetic field. An MLU amplifier includes a plurality of the MLU cells. The MLU amplifier has large gains, extended cut off frequencies and improved linearity.

9 Claims, 6 Drawing Sheets

(51) Int. Cl.
*G11C 11/16* (2006.01)
*H03K 19/18* (2006.01)

(56) References Cited

U.S. PATENT DOCUMENTS

| | | | |
|---|---|---|---|
| 7,619,431 B2* | 11/2009 | De Wilde | G01R 15/20 |
| | | | 324/750.3 |
| 8,228,702 B2* | 7/2012 | Javerliac | G11C 11/16 |
| | | | 365/158 |
| 2005/0216244 A1 | 9/2005 | Nahas | |
| 2010/0193890 A1 | 8/2010 | Suzuki et al. | |
| 2012/0201073 A1 | 8/2012 | Berger et al. | |

* cited by examiner

Fig. 1 (State of art)

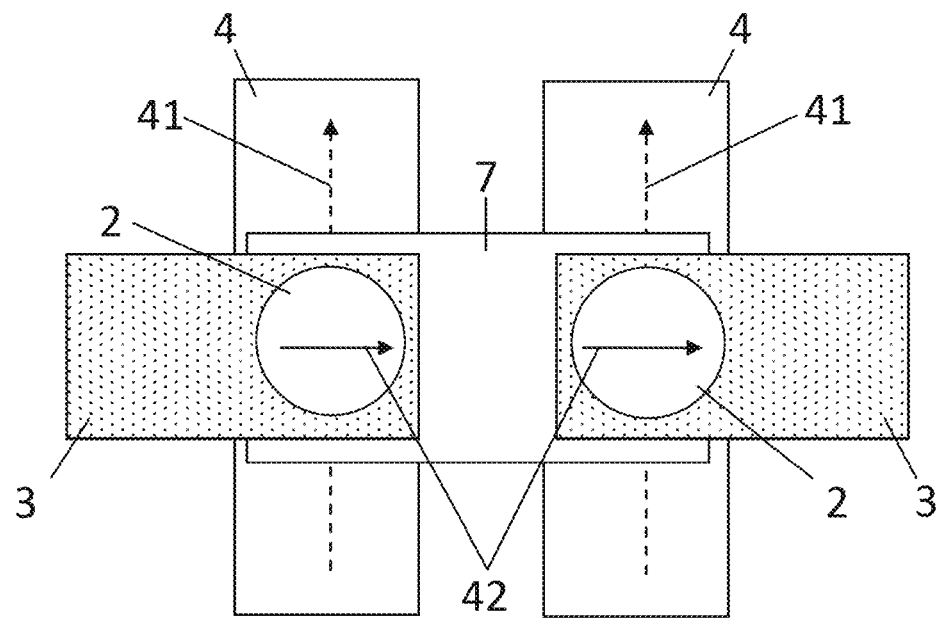
Fig. 2b
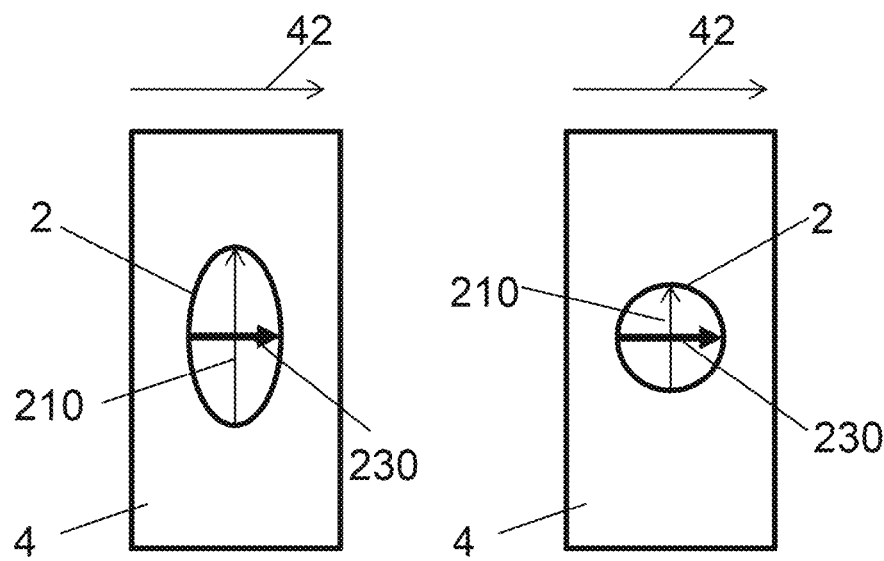
Fig. 3a                    Fig. 3b

MAGNETIC LOGIC UNIT (MLU) CELL AND AMPLIFIER HAVING A LINEAR MAGNETIC SIGNAL

FIELD

The present invention concerns a Magnetic logic unit (MLU) cell and amplifier having a linear magnetic signal.

DESCRIPTION OF RELATED ART

A conventional MRAM cell comprises a magnetic tunnel junction comprising a ferromagnetic reference layer and a ferromagnetic storage layer. When the magnetizations of the two layers are aligned the resistance of the stack is low, this could be a "0" (or arbitrarily a "1"). When the layers are anti-aligned the resistance is high, this could be a "1" (or vice versa).

In thermally-assisted-switching (TAS) MRAM's the storage layer is blocked by an antiferromagnetic layer such as to achieve superior stability in normal operating temperatures. During a programming cycle, the temperature of the cell is momentarily locally raised above a blocking temperature of the antiferromagnetic layer, through resistive heating of the magnetic tunnel junction, allowing the magnetoresistance of the TAS-MRAM cell to be varied. At normal operating temperatures the information stored in TAS-MRAM memory cells is thus not affected by external fields and noise.

Self-referenced MRAM cells can be based on TAS MRAM cells. Self-referenced MRAM cells typically have the reference layer that is not pinned by an antiferromagnetic layer but is free to be varied. Such unpinned reference layer is often called "sense layer". When a current is applied in a field line adjacent to the MRAM cell, a magnetic field is generated such as to vary the sense layer magnetization during a read operation. A two-phase read operation utilizes the natural tendency of an un-driven field line's effect on a selected memory cell to create a momentary reference value that is compared to the cell's value when the field is driven. The stored information is thus read as this field is applied.

It has been previously reported that self-reference structures based on magnetic random access memory (MRAM) cells can utilize programming field lines for controlling the terminal that modulates the resistivity of magnetic tunnel junctions in a way that is similar to modulating the resistivity of an MOS channel of a transistor gate. However, the gain of each three-terminal MRAM cell is extremely low; the feed forward coupling capacitance between input and output is remarkably tiny.

A magnetic logic unit (MLU) cell is built on the self-referenced TAS MRAM technology. During logic operations the field lines are acting as controlling gates modulating the resistivity of the magnetic tunnel junction. The MLU cell behaves as a three-terminal device capable of performing native logical functions. The currents circulating in the field line can be modulated in direction, and intensity.

Traditional active devices for power amplifiers are based out of bipolar, MOS, GaAS HBT, GaN transistors connected together to form a structure large enough to handle the power. Matching passive component circuits are used to extract the AC output power for high frequency applications. This suggested MLU amplifier is based on connecting together thousands of MTJs to get the desired power out.

A MLU amplifier can be provided by electrically coupling an array comprising several (possibly tens of thousands) of MLU cells together. The gain of the resulting amplifier is largely increased device while the coupling capacitance remains very small.

For each MLU cell, the magnetoresistance of the magnetic tunnel junction is modulated by the direction of a field current flowing through a field line which is set by an input bit to be matched. A high or low magnetoresistance at the output indicates whether the input bit matches the stored bit or not, respectively.

The total output power delivered by the array of MLU cells (MLU amplifier) is given by Equation 1:

$$P_{out} = N \times P_{mtj} \qquad \text{(Equation 1)},$$

where N is the total number of magnetic tunnel junctions in the array, and $P_{mtj}$ the power delivered by a single magnetic tunnel junction. Considering that each MLU cell is very small, for example down to 100 nm, the total output power can be high in an array comprising a millions of magnetic tunnel junctions. Moreover, the MLU amplifier is an active device that can be built without any CMOS substrate. Consequently, a low cost five mask process on a bare substrate can be appropriate to manufacture such MLU amplifier. Only two extra masking processes on a standard CMOS process will enable System On a Chip capability that integrates MLU amplifier solutions.

FIG. 1 shows an output voltage and an output current generated by the MLU amplifier upon passing an input current in a current line electrically connecting in series the plurality of MLU cells. For Class A operation the input current need to be set at the cutoff level where the output impedance is in the middle of the potential excursion to deliver the highest gain. The AC signal at the input stage will create large resistance variations in the output stage, creating a large output signal.

For linear amplification, class A, this current needs to be adjusted to the particular point where slope of the IV curve is the highest. For maximum power efficiency, class C, the input set up will be where the DC power is at its minimum (all magnetic tunnel junctions having their storage and sense magnetization parallel).

The output of the MLU cell and of the MLU amplifier can be determined by a hysteresis loop reporting the applied magnetic field against the magnetization of the MLU cell(s). The presence of a large hysteresis curve will prevent the MLU amplifier to operate on a class C mode, and will require at least a full 1 mA input peak current swing to operate class C.

SUMMARY

The present disclosure concerns a magnetic logic unit (MLU) cell comprising: a first magnetic tunnel junction and a second magnetic tunnel junction, each magnetic tunnel junction comprising a first magnetic layer having a first magnetization, a secondmagnetic layer having a second magnetization that is reversible at a high temperature threshold and pinned at a low temperature threshold, and a tunnel barrier layer between the first and second magnetic layer; a strap electrically connecting one end of the first magnetic tunnel junction in series with one end of the second magnetic tunnel junction; and a field line for passing a field current such as to generate an external magnetic field adapted to switch the first magnetization; the first magnetic layer being arranged such that the magnetic tunnel junction magnetization varies linearly with the generated external magnetic field.

The present disclosure also concerns an MLU amplifier comprising a plurality of the MLU cell, wherein the MLU cells are electrically connected in series via a current line.

The disclosed MLU amplifier has large gains and extended cut off frequencies. The MLU amplifier maximizes the linearity and/or the TMR.

BRIEF DESCRIPTION OF THE DRAWINGS

The invention will be better understood with the aid of the description of an embodiment given by way of example and illustrated by the figures, in which:

FIG. 1 represents an output voltage and an output current generated by the MLU amplifier;

FIG. 3a illustrates a plan view of the magnetic tunnel junction with the sense layer having a shape anisotropy, according to an embodiment;

FIG. 3b shows a plan view of the magnetic tunnel junction with the sense layer having a uniaxial magnetocrystalline anisotropy, according to an embodiment;

DETAILED DESCRIPTION OF POSSIBLE EMBODIMENTS

Figure 2A:
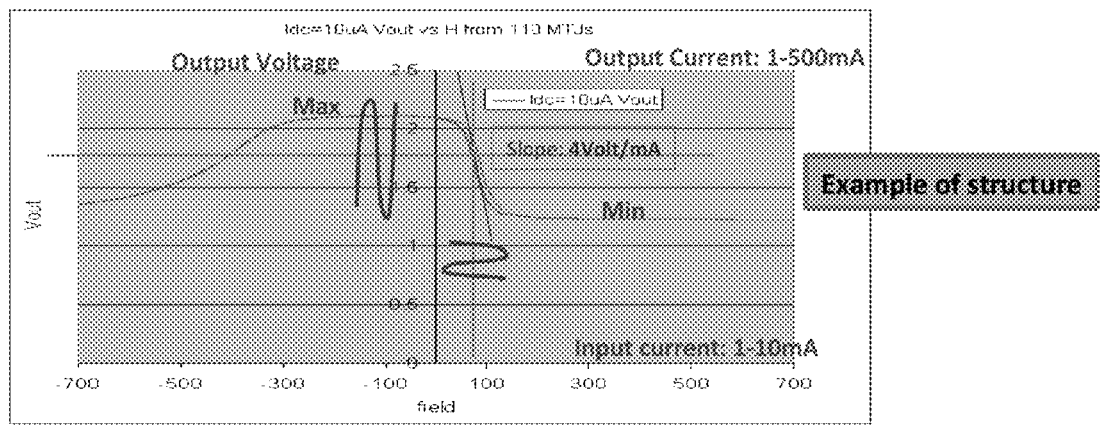
FIG. 2 shows a cross section view (a) and a top view (b) of a magnetic logic unit (MLU) cell comprising a magnetic tunnel junction including a sense layer.

FIG. 2 shows a cross section view (a) and a top view (b) of an MLU cell 1. The MLU cell 1 comprises a first and a second magnetic tunnel junction 2, each of the two magnetic tunnel junctions 2 being electrically connected in series at one end via a strap 7. The other end of each of the magnetic tunnel junctions 2 is electrically connected to a current line 3. The current line 3 can be used to pass a heating current during a write operation or a read current during a read operation. The MLU cell 1 further comprises a field line 4 arranged for passing a field current 41 such as to generate an external magnetic field 42. In the example of FIG. 2, the field line 4 is represented as two parallel field line portions 4' located at the end of the magnetic tunnel junctions 2 connecting the strap 7. The field line 4 (or each of the field line portions 4') can preferably comprise a cladding. Each magnetic tunnel junction 2 comprises a first magnetic layer (or sense layer) 21 having a first magnetization (or sense magnetization) 210, a second magnetic layer (or storage layer) 23 having a second magnetization 230 (or storage magnetization), and a tunnel barrier layer 22 separating the sense magnetic layer 21 from the storage magnetic layer 23.

The first magnetization 210 can be reversible and the second magnetization 230 can be adjustable when the magnetic tunnel junction 2 is at a high temperature threshold and pinned at a low temperature threshold. The magnetic tunnel junction 2 can further comprise an antiferromagnetic layer 24 arranged for pinning the second magnetization at a low temperature threshold and freeing it at a high temperature threshold.

In the case no current passes in the current line 3, the storage and sense magnetizations are aligned antiparallel. The sense magnetizations can be aligned in a parallel fashion by passing a field current in the filed lines 4.

Figure 4:
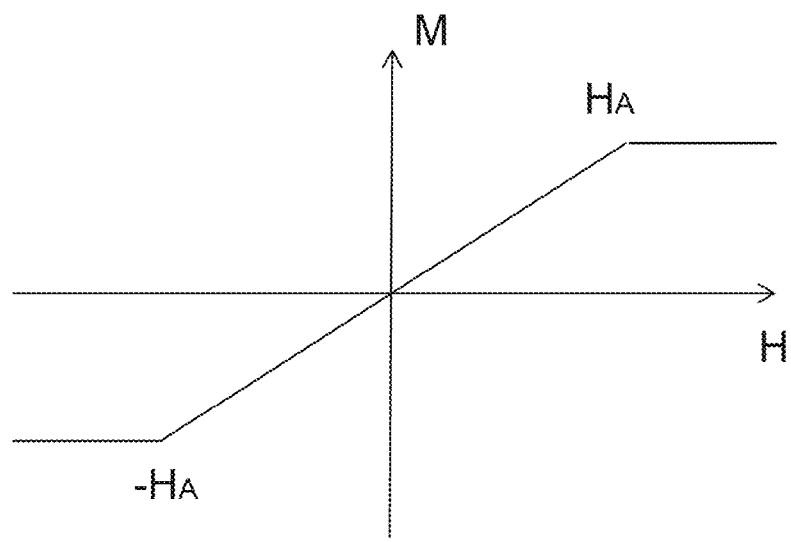
FIG. 4 represents a magnetization curve for the magnetic tunnel junction according to the embodiments of FIGS. 3a and 3b.

In an embodiment shown in FIG. 3, the sense magnetization 210 comprises an anisotropy that is substantially perpendicular to the storage magnetization 230 and parallel to the field line 4. In such configuration, passing the field current 41 in the field line 4 will generate the external magnetic field 42 with an orientation being substantially perpendicular with the direction of the sense magnetization 210. The corresponding magnetization curve represented in FIG. 4 does not show any opening of the hysteresis loop, but rather a linear variation of the magnetic tunnel junction magnetization M (corresponding to the variation in the sense magnetization 210) with the magnitude H of the applied external magnetic field 42 until the applied external magnetic field 42 reaches a saturation magnetic field $H_{SAT}$.

In a variant of the embodiment shown in FIG. 3a, the anisotropy is obtained by the sense layer 21 comprising an anisotropic shape with the long dimension of the anisotropic shape being substantially perpendicular to the storage magnetization 230 and substantially parallel to the field line 4. In the particular example of FIG. 3a, the anisotropic shape is obtained by the sense layer 21 having elliptically shape with the long axis being substantially perpendicular to the storage magnetization 230 and substantially parallel to the field line 4.

In another variant of the embodiment shown in FIG. 3b, the anisotropy is obtained by the sense layer 21 comprising a uniaxial magnetocrystalline anisotropy being oriented substantially perpendicular to the storage magnetization 230 and substantially parallel to the field line 4.

In another embodiment, the MLU cell 1 further comprises a weak transverse biasing field 52 (see FIG. 2a) adapted to orient the sense magnetization 210 substantially perpendicular to the storage magnetization 230 and substantially parallel to the field line 4. The transverse biasing field 52 can be generated by a permanent magnet 50 located, for example, at one end of the magnetic tunnel junctions 2 on the side of the field line 4 or on the side opposed to the field line 4.

Prior to the use of the MLU cell, the storage layer 23 is preferably stabilized by using an annealing step while applying a uniform external field or by writing using the field line 4.

Figure 5:
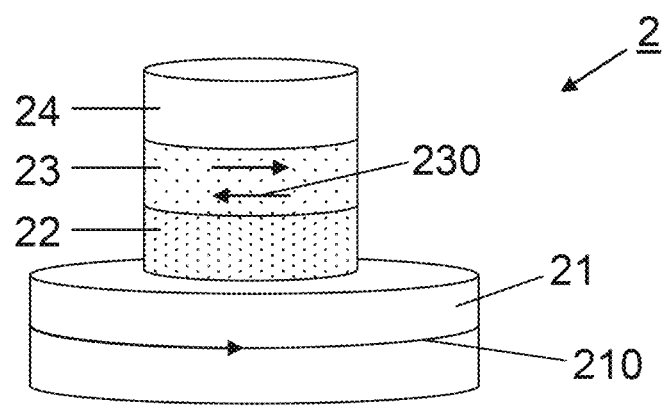
FIG. 5 illustrates the magnetic tunnel junction with the sense layer having a vortex micromagnetic configuration, according to an embodiment.

In yet another embodiment shown in FIG. 5, the sense layer 21 comprises a vortex micromagnetic configuration of the sense magnetization 210. The storage layer 23 can comprise a synthetic antiferromagnet or "SAF" storage layer.

Referring to FIG. 6, a plan view of the sense layer 21 is shown, wherein the sense magnetization 210 represented by the arrows comprises a magnetization vortex 8. The magnetization vortex 8 can be obtained by having the shape of the sense layer 21 with an aspect ratio that is approximately 1 (and preferably less than 1.3) and with a predetermined thickness.

Figures 6A, 6B, 6C:
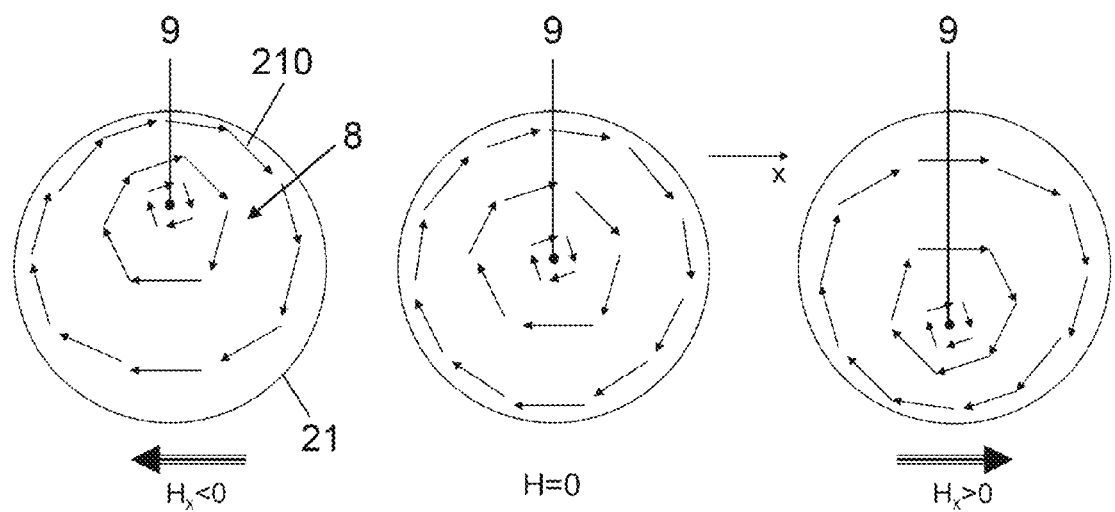
FIG. 6 represents a plan view of the sense layer comprising the vortex micromagnetic configuration as a function of applied magnetic field, according to an embodiment.

In particular, FIG. 6a represents the sense magnetization vortex 8 in the absence of the external magnetic field 42, with a vortex center 9 being substantially at a center of the sense layer cross-section. In this configuration, the sense layer 21 has a net magnetic moment that is substantially zero (H=0).

Applying the external magnetic field 42 along the easy axis of the sense layer 21, for example during a read operation of the MLU cell 1, causes the vortex center 9 to move in a direction being substantially perpendicular to the easy axis of the sense layer 21. In particular, FIG. 6b shows the vortex center 9 being moved upwards upon applying the external magnetic field 42 in a first direction represented toward the left in FIG. 6b. FIG. 6c shows the vortex center 9 being moved downwards upon applying the external magnetic field 42 in a second direction, opposed to the first direction. The displacement of the vortex center 9 upwards (FIG. 6b) results in a net magnetic moment H<0 in the sense layer 21, whereas the displacement of the vortex center 9 downwards upwards (FIG. 6c) results in a net magnetic moment H>0 in the sense layer 21.

Figure 7:
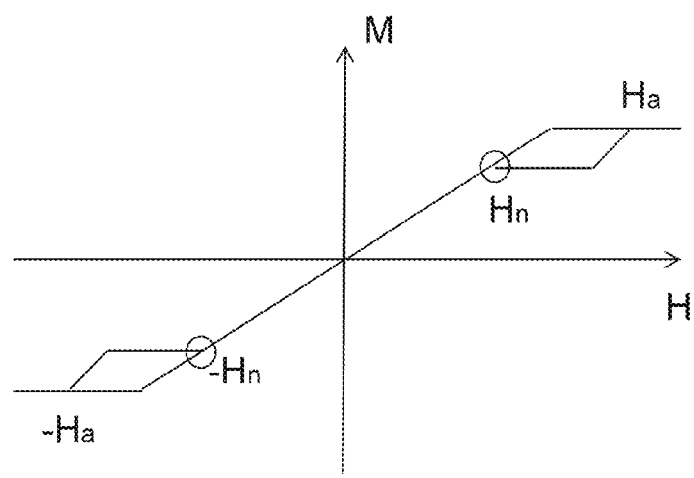
FIG. 7 represents a magnetization curve for the magnetic tunnel junction according to the embodiments of FIGS. 5 and 6.

As long as the applied magnetic field 42 is within the magnitudes corresponding to the nucleation field ($H_n$) of the vortex 8 and annihilation field ($H_a$) of the vortex 8 in the sense magnetization 210, the hysteresis response to the applied external magnetic field 42 (see FIG. 7) comprises a reversible linear portion corresponding to the movement of the vortex center 9 perpendicular to the applied external magnetic field 42. The values and the slope of the linear part of hysteresis loop are strongly dependent on the size of the sense layer 21.

Figure 8:
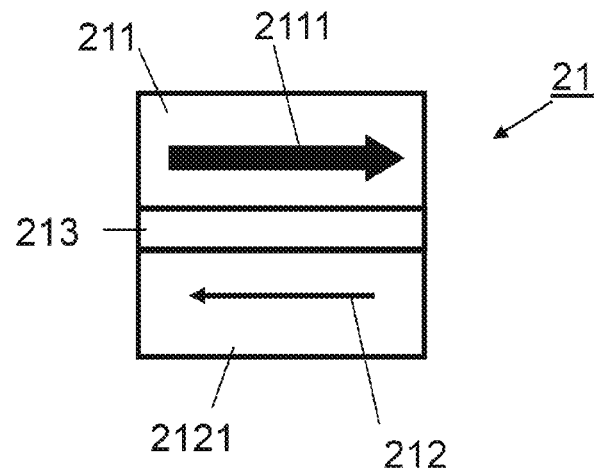
FIG. 8 illustrates the sense layer with a synthetic antiferromagnet (SAF), according to an embodiment.

In yet another embodiment shown in FIG. 8, the sense layer 21 comprises a SAF sense layer. In particular, the sense layer 21 comprises a first sense ferromagnetic layer 211 having a first sense magnetization 2111, and a second sense ferromagnetic layer 212 having a second sense magnetization 2121. The magnetization of the two sense ferromagnetic layers 211, 212 is coupled in an anti-parallel direction due to the presence of a anti-parallel coupling layer 213. The two sense ferromagnetic layers 211, 212 can be made of a CoFe, CoFeB or NiFe alloy and have a thickness typically comprised between about 1.5 nm and about 4 nm. The storage anti-parallel coupling layer 232 can be realized using a non-magnetic separating layer with material selected from a group consisting of ruthenium, chromium, rhenium, iridium, rhodium, silver, copper and yttrium. Preferably, the anti-parallel coupling layer 213 is made of ruthenium and has a thickness typically comprised between about 0.6 nm and 2 nm, preferably between 0.6 nm and about 0.9 nm or between about 1.6 nm and about 2 nm.

Figure 9:
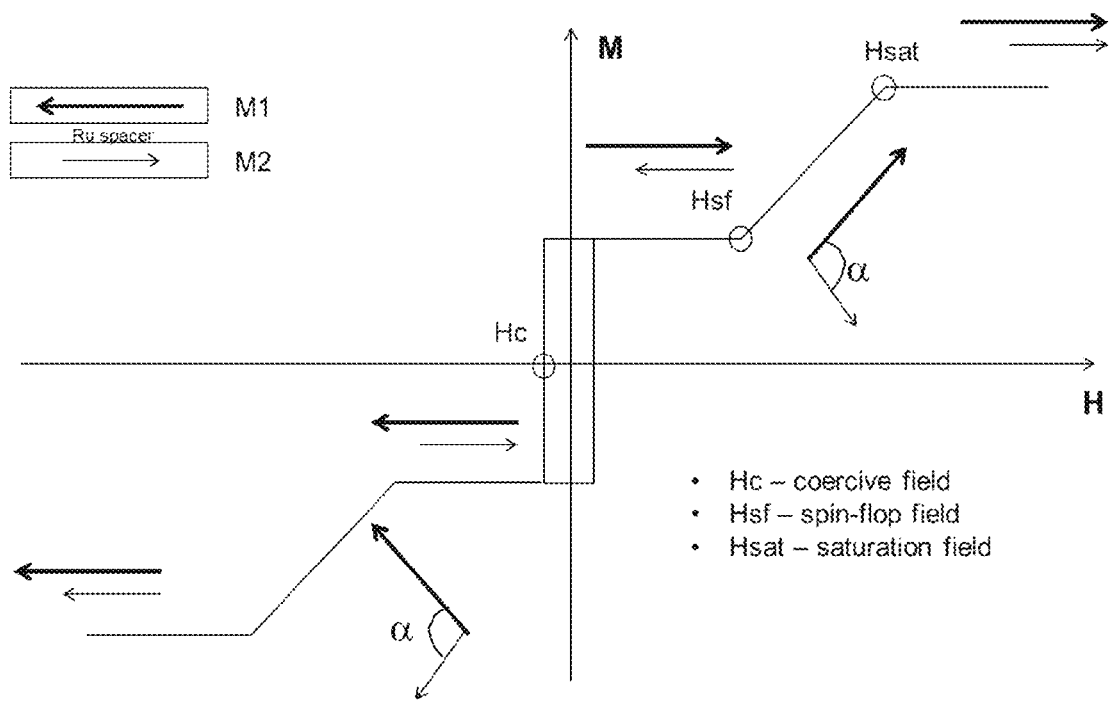
FIG. 9 shows a magnetization curve of the sense layer with the SAF, according to an embodiment.

FIG. 9 represents a magnetization curve of the SAF sense layer 21 for the case where the external magnetic field 42 is applied substantially perpendicular to the anisotropy axis of the sense layer 21. Symbol H denote the magnitude of the magnetic field 42 and symbol M denotes the magnetization values of the first and second sense magnetization 2111, 2121.

The SAF sense layer 21 is configured such that the magnetization response curve shows a hysteresis loop delimited by spin-flop value $H_{SF}$ of the magnetic field 42. When the magnitude of the magnetic field 42 is increased above a value corresponding to the spin-flop value $H_{SF}$, the first sense magnetization 2111 is no more antiparallel with the second sense magnetization 2121 but forms a predetermined angle α with the second sense magnetization 2121. When the magnetic field is further increased, the first sense magnetization 2111 becomes oriented substantially parallel to the second sense magnetization 2121. The magnitude of the magnetic field 42 required to orients the first sense magnetization 2111 substantially parallel to the second sense magnetization 2121 is referred to as the saturation magnetic field $H_{SAT}$.

The magnetization curve shows a hysteresis loop delimited by spin-flop value $B_{SF}$ of the magnetic field 42. When the magnitude of the magnetic field 42 is increased above a value corresponding to the spin-flop value $B_{SF}$, the first storage magnetization 233 is no more antiparallel with the second storage magnetization but forms a predetermined angle α with the second storage magnetization (see FIGS. 4a and 4b). When the magnetic field is further increased, the first storage magnetization 233 becomes oriented substantially parallel to the second storage magnetization 234. The magnitude of the magnetic field 42 required to orients the first storage magnetization 233 substantially parallel to the second storage magnetization 234 is referred to as the saturation magnetic field $B_{SAT}$.

A linear response on the hysteresis loop can thus be obtained for a magnitude H of the external magnetic field 42 comprised between the spin-flop value $H_{SF}$ and the saturation magnetic field $H_{SAT}$.

Increasing TMR of the magnetic tunnel junction 2 can also increase the difference between the two states, and increase linearity of the response.

Figure 10:
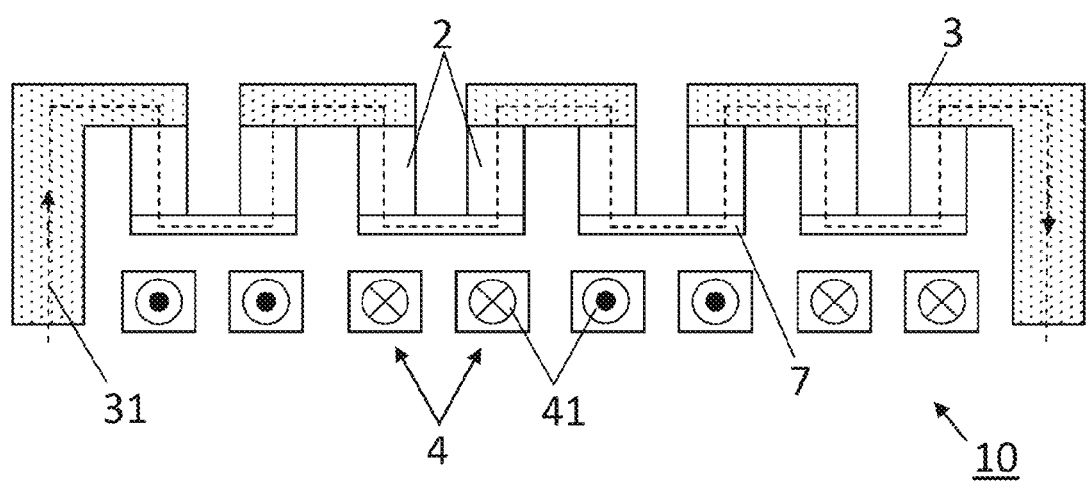
FIG. 10 shows a MLU amplifier comprising a plurality of MLU cells electrically connected in series, according to an embodiment.

FIG. 10 shows an MLU amplifier comprising a plurality of MLU cells 1 disclosed herein, the MLU cells 1 being electrically connected in series via the current line 3. In particular, the magnetic tunnel junctions of the plurality of MLU cells are all connected in series with each other via the current line 3 and the strap 7. Such configuration allows for increasing the output signal and the current gain.

The plurality of MLU cells is electrically connected in series in a way such as to avoid contact to the substrate. The field lines 4 of each MLU cell are electrically connected in series such as to form a continuous field line 4 in the array. In such an arrangement, the field line 4 can take the shape of a serpentine.

REFERENCE NUMBERS

MLU cell
MLU amplifier
2 first magnetic tunnel junction
2' second magnetic tunnel junction
21 ferromagnetic sense layer
210 sense magnetization
211 first sense ferromagnetic layer
2111 first sense magnetization
212 second sense ferromagnetic layer
2121 second sense magnetization
213 anti-parallel coupling layer
23 ferromagnetic storage layer
24 antiferromagnetic layer
230 storage magnetization
3 current line
4 field line
41 field current
42 magnetic field
50 permanent magnet
52 biasing field
7 strap
8 magnetization vortex
9 vortex center
α angle
H magnitude of the magnetic field 42

$H_a$ annihilation field of the vortex
$H_n$ nucleation field of the vortex
$H_{SAT}$ saturation magnetic field
$H_{SF}$ spin-flop value of the magnetic field 42
$P_{out}$ output power
$P_{mtj}$ power delivered by a magnetic tunnel junction
N number of magnetic tunnel junctions

The invention claimed is:

1. Magnetic logic unit (MLU) cell comprising:
a first magnetic tunnel junction and a second magnetic tunnel junction, each magnetic tunnel junction comprising a first magnetic layer having a first magnetization, a second magnetic layer having a second magnetization that is reversible at a high temperature threshold and pinned at a low temperature threshold, and a tunnel barrier layer between the first magnetic layer and second magnetic layer;
a strap, electrically connecting one end of the first magnetic tunnel junction in series with one end of the second magnetic tunnel junction; and
a field line for passing a field current that generates an external magnetic field adapted to switch the first magnetization;
the first magnetic layer being arranged such that the first magnetization varies linearly with the generated external magnetic field.

2. The MLU cell according to claim 1, wherein the first magnetization of the first magnetic layer comprises an anisotropy that is substantially perpendicular to the second magnetization and substantially parallel to the field line.

3. The MLU cell according to claim 2, wherein the first magnetic layer comprises an elliptical shape with its long axis being substantially perpendicular to the second magnetization and substantially parallel to the field line.

4. The MLU cell according to claim 2, wherein the first magnetic layer has a uniaxial magnetocrystalline anisotropy being substantially perpendicular to the storage magnetization and substantially parallel to the field line.

5. The MLU cell according to claim 2, further comprising a biasing field adapted to orient the first magnetization substantially perpendicular to the second magnetization and substantially parallel to the field line.

6. The MLU cell according to claim 5, further comprising a permanent magnet for generating the biasing field.

7. The MLU cell according to claim 1, wherein the first magnetic layer is arranged such as to comprise a vortex configuration with a vortex center and wherein the vortex center can move substantially perpendicular to the external magnetic field when the external magnetic field is applied.

8. The MLU cell according to claim 1, wherein the first magnetic layer comprises a synthetic antiferromagnet sense layer, and the field line is arranged for applying the external magnetic field substantially parallel to the anisotropy axis of the first magnetic layer when the field current is passed, and wherein the first magnetic layer is further configured such that the magnetization response curve has a linear portion when the external magnetic field is applied between a spin-flop value and a saturation magnetic field.

9. MLU amplifier comprising a plurality of MLU cells, each MLU cell comprising: a first magnetic tunnel junction and a second magnetic tunnel junction, each magnetic tunnel junction comprising a first magnetic layer having a first magnetization, a second magnetic layer having a second magnetization that is reversible at a high temperature threshold and pinned at a low temperature threshold, and a tunnel barrier layer between the first magnetic layer and second magnetic layer; a strap, electrically connecting one end of the first magnetic tunnel junction in series with one end of the second magnetic tunnel junction; and a field line for passing a field current that generates an external magnetic field adapted to switch the first magnetization; the first magnetic layer being arranged such that the first magnetization varies linearly with the generated external magnetic field;
wherein the MLU cells are electrically connected in series via a current line.

* * * * *

UNITED STATES PATENT AND TRADEMARK OFFICE
CERTIFICATE OF CORRECTION

PATENT NO.        : 9,583,695 B2
APPLICATION NO.   : 14/431125
DATED             : February 28, 2017
INVENTOR(S)       : Ioan Lucian Prejbeanu et al.

Page 1 of 1

It is certified that error appears in the above-identified patent and that said Letters Patent is hereby corrected as shown below:

In the Specification

Under the Brief Description of the Drawings:

Column 3, Lines 15-17: please amend as follows:
  Fig. 2a shows a cross section view of a magnetic logic unit (MLU) cell comprising a magnetic tunnel junction including a sense layer;
  Fig. 2b shows a top view of a magnetic logic unit (MLU) cell comprising a magnetic tunnel junction including a sense layer;

Column 3, Lines 30-32: please amend as follows:
  Figs. 6a, 6b and 6c represent a plan view of the sense layer comprising the vortex micromagnetic configuration as a function of applied magnetic field, according to an embodiment;

Column 6, Line 43: please amend as follows:
1 MLU cell
10 MLU amplifier

Signed and Sealed this
Twenty-third Day of May, 2017

Michelle K. Lee
*Director of the United States Patent and Trademark Office*